(12) United States Patent
Ye et al.

(10) Patent No.: US 11,050,006 B2
(45) Date of Patent: Jun. 29, 2021

(54) DISPLAY DEVICE AND LIGHT SOURCE MODULE HAVING HIGH COLOR CONVERSION EFFICIENCY THEREOF

(71) Applicant: HARVATEK CORPORATION, Hsinchu (TW)

(72) Inventors: Zhi-Ting Ye, Miaoli County (TW); Shyi-Ming Pan, Miaoli County (TW); Yu-Cheng Lan, Chiayi (TW); Ching-Ho Tien, Changhua County (TW)

(73) Assignee: HARVATEK CORPORATION, Hsinchu (TW)

( * ) Notice: Subject to any disclaimer, the term of this patent is extended or adjusted under 35 U.S.C. 154(b) by 0 days.

(21) Appl. No.: 16/218,679

(22) Filed: Dec. 13, 2018

(65) Prior Publication Data
US 2019/0189864 A1 Jun. 20, 2019

(30) Foreign Application Priority Data

Dec. 14, 2017 (TW) .................................. 106144003

(51) Int. Cl.
| H01L 33/00 | (2010.01) |
| H01L 33/50 | (2010.01) |
| H01L 25/075 | (2006.01) |
| H01L 33/58 | (2010.01) |
| F21K 9/64 | (2016.01) |
| H01L 33/56 | (2010.01) |
| F21Y 115/10 | (2016.01) |
| H01L 33/46 | (2010.01) |

(52) U.S. Cl.
CPC .............. *H01L 33/504* (2013.01); *F21K 9/64* (2016.08); *H01L 25/0753* (2013.01); *H01L 33/56* (2013.01); *H01L 33/58* (2013.01); *F21Y 2115/10* (2016.08); *H01L 33/46* (2013.01)

(58) Field of Classification Search
CPC .................................................. H01L 25/0753
See application file for complete search history.

(56) References Cited

U.S. PATENT DOCUMENTS

| 2010/0026919 | A1* | 2/2010 | Yamauchi | ............ | G02B 5/0252 |
| | | | | | 349/5 |
| 2015/0175835 | A1* | 6/2015 | Ge | ........ | C09D 133/12 |
| | | | | | 428/337 |
| 2017/0287787 | A1* | 10/2017 | Kim | ....... | G06F 30/398 |
| 2017/0287887 | A1 | 10/2017 | Takeya et al. | | |

(Continued)

FOREIGN PATENT DOCUMENTS

| CN | 102707536 A | 10/2012 |
| CN | 103109212 A | 5/2013 |
| CN | 103764788 A | 4/2014 |

(Continued)

*Primary Examiner* — Suberr L Chi
(74) *Attorney, Agent, or Firm* — Li & Cai Intellectual Property (USA) Office

(57) ABSTRACT

A light source module includes a lighting structure, a light diffusing layer, a wavelength converting layer, and a cover plate. The lighting structure includes a plurality of light emitting elements that are all blue-light emitting elements. The light diffusing layer is disposed on the lighting structure, the wavelength converting layer is disposed on the light diffusing layer, and the cover plate is disposed on the wavelength converting layer.

14 Claims, 4 Drawing Sheets

(56) References Cited

U.S. PATENT DOCUMENTS

2019/0123033 A1* 4/2019 Martin .................... H01L 24/83

FOREIGN PATENT DOCUMENTS

| CN | 104040382 A | 9/2014 |
| CN | 106449703 A | 2/2017 |
| CN | 106547136 A | 3/2017 |
| CN | 107024797 A | 8/2017 |

* cited by examiner

DISPLAY DEVICE AND LIGHT SOURCE MODULE HAVING HIGH COLOR CONVERSION EFFICIENCY THEREOF

CROSS-REFERENCE TO RELATED PATENT APPLICATION

This application claims the benefit of priority to Taiwan Patent Application No. 106144003, filed on Dec. 14, 2017. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source module, and more particularly to a light source module that uses blue-light emitting elements to produce varying color lights and a display device using the same.

BACKGROUND OF THE DISCLOSURE

Light-emitting diodes (LEDs) have many advantages including small size, high luminous efficiency and low energy consumption. Nowadays, displace devices are developed with the trend toward thinness and high efficiency, and thus have begun to employ LED light sources.

The conventional LED light source used in the displace devices generally arranges red, green and blue LED chips in a package so as to mix red, green and blue lights into a white light. However, the at least three types of LED chips in the LED light source have different aging speeds and brightness decaying speeds that may result in the shift of the color temperature in a long-term operation. In addition, the conventional LED light source needs to apply different powers to the at least three types of LED chips respectively and thus has a complicated design of the driving circuit.

SUMMARY OF THE DISCLOSURE

In response to the above-referenced technical inadequacies, the present disclosure provides a light source module and a display device using the same.

In one aspect, the present disclosure provides a light source module which includes a lighting structure, a light diffusing layer, a wavelength converting layer, and a cover plate. The lighting structure includes a substrate and at least three blue-light emitting elements, wherein the substrate has a first region, a second region adjacent to the first region, and a third region adjacent to the second region, and the blue-light emitting elements are respectively disposed in the first region, the second region, and the third region. The light diffusing layer is disposed on the lighting structure. The wavelength converting layer is disposed on the light diffusing layer, wherein the wavelength converting layer includes a first converting layer disposed in the first region, a second converting layer disposed in the second region, and a transparent layer disposed in the third region. A blue light generated from one of the blue-light emitting elements and emitted from the first region is converted to a red light via the first converting layer. A blue light generated from another one of the blue-light emitting elements and emitted from the second region is converted to a green light via the second converting layer. The cover plate is disposed on the wavelength converting layer. The blue-light reflecting layer is disposed on the cover plate and covers the first converting layer and the second converting layer.

In one aspect, the present disclosure provides a display device which includes a plurality of light source modules described above.

In certain embodiments, the light diffusing layer is formed from a silicone resin with light diffusing particles dispersed therein.

In certain embodiments, the content of the light diffusing particles is 5% by weight to 25% by weight based on the total weight of the light diffusing layer. The light diffusing particles are titanium dioxide particles having a mean particle size between 20 nm and 70 nm.

In certain embodiments, the first converting layer contains red phosphors, the second converting layer contains green phosphors, and the transparent layer is formed from a silicone resin.

In certain embodiments, the cover plate is a glass cover plate.

In certain embodiments, the glass cover plate has a first surface proximate to the wavelength converting layer and a second surface opposite to the first surface, and the blue-light reflecting layer is formed on the first surface.

In certain embodiments, the glass cover plate has a first surface proximate to the wavelength converting layer and a second surface opposite to the first surface, and the blue-light reflecting layer is formed on the second surface.

In certain embodiments, each of the blue-light emitting elements is a blue LED chip for generating a blue light having a wavelength between 360 nm and 450 nm.

In certain embodiments, the wavelength converting layer further includes a first light shielding layer and a second light shielding layer. The first light shielding layer is disposed between the first converting layer and the second converting layer. The second light shielding layer is disposed between the second converting layer and the transparent layer. The first light shielding layer and the second light shielding layer jointly form a black matrix.

One of the advantages of the present disclosure is that the light source module of the present disclosure includes a lighting structure, in which the light emitting elements of the lighting structure are all blue-light emitting elements, a light diffusing layer disposed on the lighting structure and a wavelength converting layer disposed on the light diffusing layer, and therefore the product cost and the complexity of the driving circuit can be reduced. Furthermore, the product defects caused by different brightness decaying speeds and driving voltages of the light emitting elements can be avoided.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
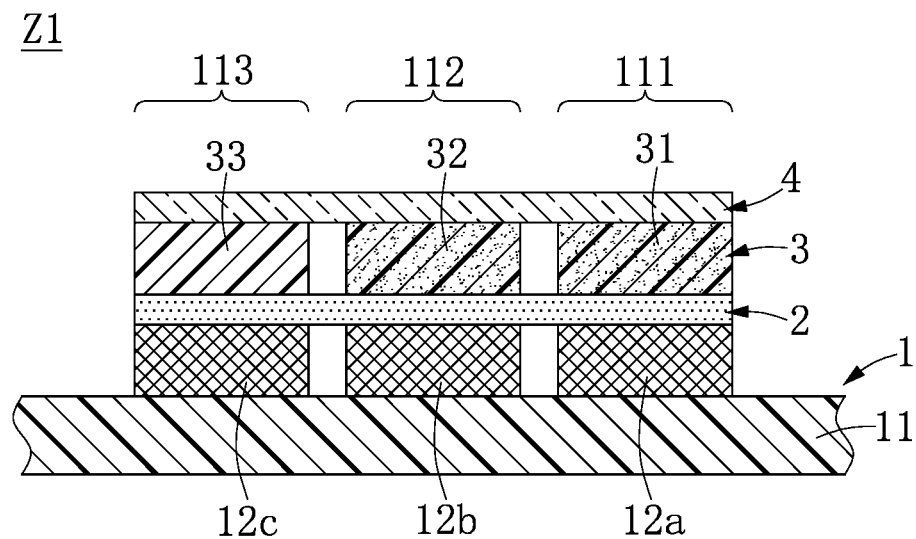
FIG. 1 is a schematic view of a light source module according to the first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
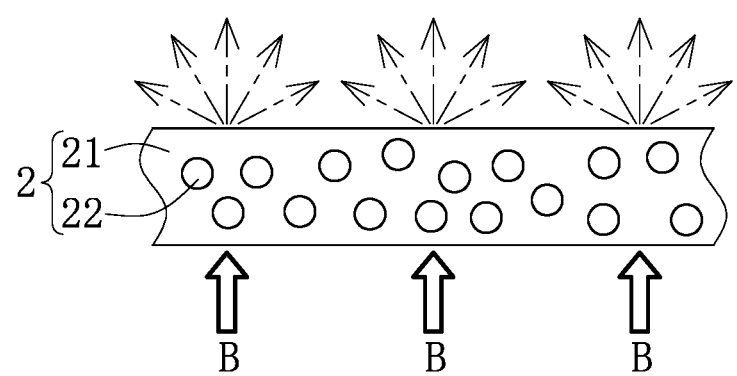
FIG. 2 is a schematic view showing emission lights which project to a light diffusing layer of the light source module according to the first embodiment of the present disclosure.
Figure 3:
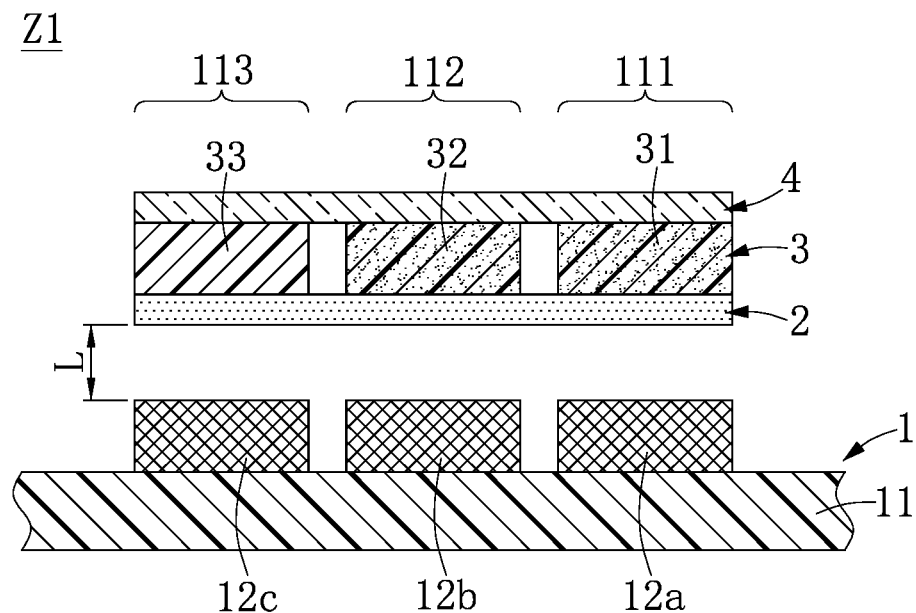
FIG. 3 is another schematic view of the light source module according to the first embodiment of the present disclosure.

Referring to FIG. 1 to FIG. 3, a first embodiment of the present disclosure provides a light source module Z1 which includes a lighting structure 1, a light diffusing layer 2, a wavelength converting layer 3, and a cover plate 4.

As shown in FIG. 1, the lighting structure 1 includes a substrate 11 and a plurality of blue-light emitting elements 12a, 12b, 12c. The substrate 11 is provided with a driving circuit (now shown) for applying power signals to the blue-light emitting elements 12a, 12b, 12c. The blue-light emitting elements 12a, 12b, 12c are disposed on the substrate 11 and electrically connected to the driving circuit. The blue-light emitting elements 12a, 12b, 12c generate blue lights when they receive the power signals. In the present embodiment, the substrate 11 has a first region 111, a second region 112 adjacent to the first region 111, and a third region 113 adjacent to the second region 112. The first region 111, the second region 112, and third region 113 respectively serve as a red light region, a green light region, and a blue light region, wherein the first region 111 and the second region 112 are spaced apart at a predetermined distance, and the second region 112 and the third region 113 are spaced apart at a predetermined distance.

In practice, the substrate 11 can be a printed circuit board (PCB), metal core printed circuit board (MCPCB), metal printed circuit board (MPCB) or flexible printed circuit board (FPCB), but is not limited thereto. Each of the blue-light emitting elements 12a, 12b, 12c can be a blue LED chip for generating a blue light having a wavelength between 360 and 450 nm, and be directly mounted onto the substrate 11 using chip-on-board (COB) techniques. Although, in the present embodiment, the number of the blue-light emitting elements 12a, 12b, 12c of the lighting structure 1 is three, in other embodiments, the number of the blue-light emitting elements 12a, 12b, 12c of the lighting structure 1 can be more than three. For example, each of the first, second, and third regions of the substrate 11 can have two blue-light emitting elements 12a, 12b, 12c disposed therein to meet different brightness requirements.

It should be noted that, the light emitting elements of the lighting structure 1 are all blue LED chips that are common in the market and relatively inexpensive. Therefore, the product cost and the complexity of the driving circuit can be reduced, and the product defects caused by different brightness decaying speeds and driving voltages of the light emitting elements can be avoided.

As shown in FIG. 1 and FIG. 2, the light diffusing layer 2 is stacked on the lighting structure 1 to uniformly diffuse the lights emitted from the blue-light emitting elements 12a, 12b, 12c. The composition of the light diffusing layer 2 includes a transparent resin 21 and light diffusing particles 22 dispersed in the transparent resin 21. Specifically speaking, the light diffusing layer 2 is formed from the transparent resin 21 mixed with the light diffusing particles 22. Although, in the present embodiment, the light diffusing layer 2 is adjoining to the blue-light emitting elements 12a, 12b, 12c, in other embodiments as shown in FIG. 3, the light diffusing layer 2 can be disposed above the lighting structure 1 and over the light emission paths of the blue-light emitting elements 12a, 12b, 12c. That is to say, the light diffusing layer 2 and the blue-light emitting elements 12a, 12b, 12c have a predetermined optical path L therebetween.

The transparent resin 21 may consist of silicone, polycarbonate (PC), polymethylmethacrylate (PMMA), methacrylate-styrene copolymer (MS), polystyrene (PS), or polyethylene terephthalate (PET). The light diffusing particles 22 may include organic particles, inorganic particles, and/or combinations thereof. The organic particles may consist of polystyrene, polymethylmethacrylate, silicone, polyethylene terephthalate, or polyamide (PA). The inorganic particles may consist of zinc oxide (ZnO), silicon dioxide ($SiO_2$), titanium dioxide ($TiO_2$), zirconium oxide ($ZrO_2$), aluminum oxide ($Al_2O_3$), zinc sulfide (ZnS), or barium sulfate ($BaSO_4$). However, the aforesaid materials for the transparent resin 21 and the light diffusing particles 22 are merely examples and are not meant to limit the present disclosure.

In the present embodiment, the thickness of the light diffusing layer 2 is preferably between 0.1 μm and 0.6 μm and the transparent resin 21 thereof is preferably a silicone resin. The content of the light diffusing particles 22 is preferably 5% by weight to 25% by weight based on the total weight of the light diffusing layer 2, and the light diffusing particles 22 are preferably titanium dioxide particles having a mean particle size between 20 nm and 70 nm. However, there is no limitation to the shape of the light diffusing particles 22.

The wavelength converting layer 3 is stacked on the light diffusing layer 2 and includes a first converting layer 31, a second converting layer 32, and a transparent layer 33. The first converting layer 31 is disposed in the first region 111 for converting a blue light emitted from the blue-light emitting element 12a to a red light. The second converting layer 32 is disposed in the second region 112 for converting a blue light emitted from the blue-light emitting element 12b to a green light. The transparent layer 33 is disposed in the third region 113 for transmission of a blue light emitted from the blue-light emitting element 12c. Therefore, red, green and blue lights can be produced respectively in the first, second and third regions to output white lights.

In the present embodiment, the first converting layer 31 contains red phosphors, the second converting layer 32 contains green phosphors, and the transparent layer 33 is formed from a silicone resin, but the present disclosure is not limited thereto. For example, the first converting layer 31 may contain quantum dots, phosphors, or other wavelength converting materials that are capable of being excited by a blue light to produce a red light. The second converting layer 32 may contain quantum dots, phosphors, or other wavelength converting materials that are capable of being excited by a blue light to produce a green light. The transparent layer 33 may be formed from the aforesaid transparent resins.

It should be noted that, before entering the wavelength converting layer 3, the lights emitted from the blue-light emitting elements 12a, 12b, 12c can be uniformly diffused by the light diffusing layer 2 and the energy density thereof can be reduced. Therefore, the proportion of the wavelength converting materials such as red and green phosphors can be reduced, and the color conversion efficiency can be improved.

As shown in FIG. 1, the cover plate 4 is stacked on the wavelength converting layer 3 for protecting the lighting structure 1, light diffusing layer 2, and the wavelength converting layer 3 from being crushed and damage and uniformly outputting the produced white lights. In the present embodiment, the cover plate 4 is a glass cover plate having a thickness between 0.1 μm and 2 μm. In other embodiments, the cover plate 4 can be a plastic cover plate with high light transmittance, and the thickness thereof can be adjusted according to particular requirements. The plastic cover plate may consist of polyethylene, polycarbonate, polymethylmethacrylate, or polyethylene terephthalate.

Second Embodiment

Figure 4:
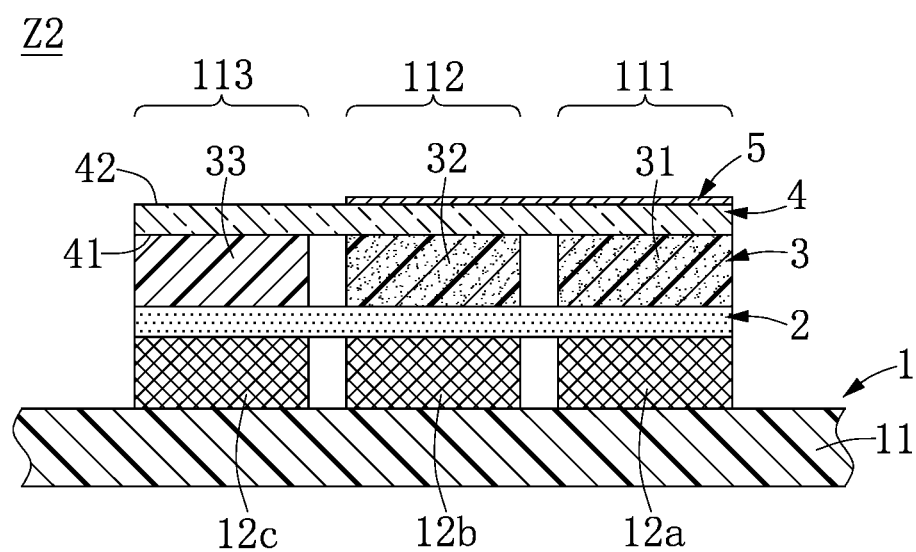
FIG. 4 is a schematic view of the light source module according to the second embodiment of the present disclosure.
Figure 5:
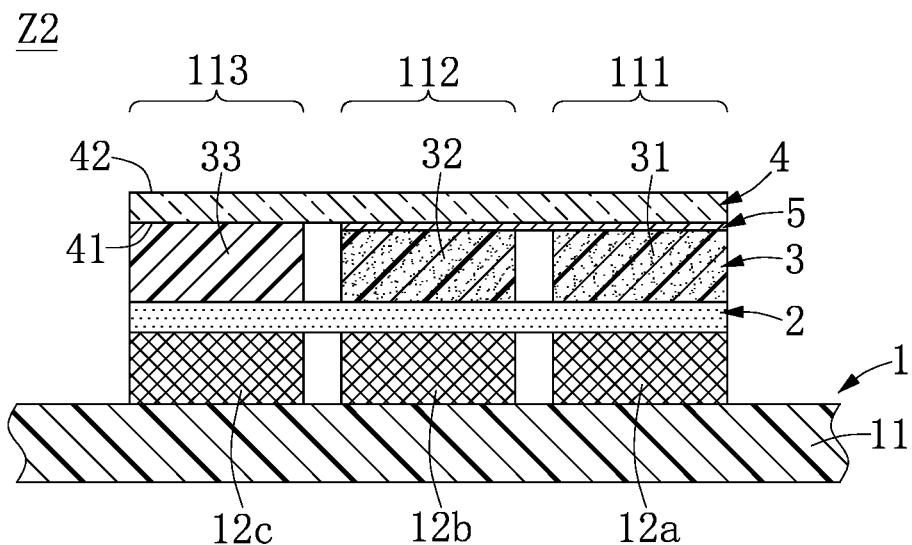
FIG. 5 is another schematic view of the light source module according to the second embodiment of the present disclosure.
Figure 6:
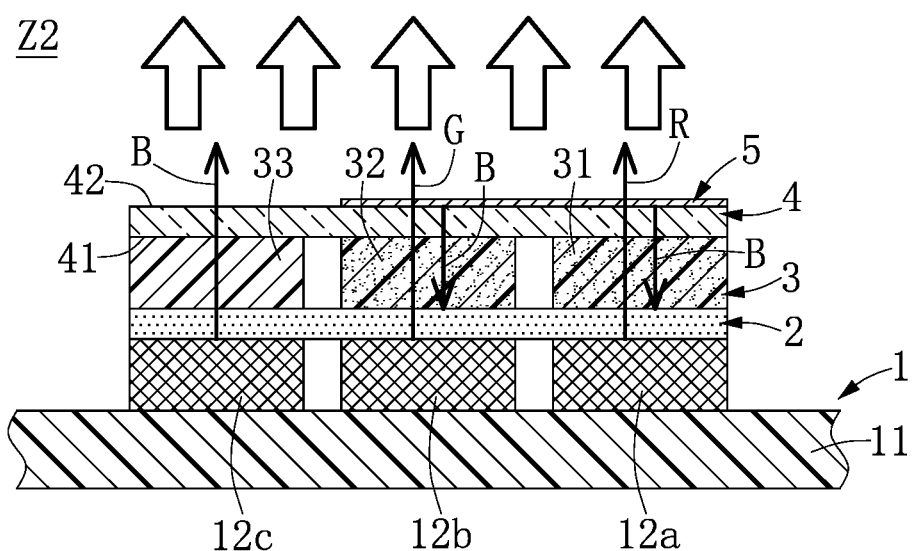
FIG. 6 is a schematic view showing emission lights which project to a blue-light reflecting layer of the light source module according to the second embodiment of the present disclosure.

Referring to FIG. 4 to FIG. 6, a second embodiment of the present disclosure provides a light source module Z2 which includes a lighting structure 1, a light diffusing layer 2, a wavelength converting layer 3, a cover plate 4, and a blue-light reflecting layer 5. The technical details and implementations of the lighting structure 1, the light diffusing layer 2, the wavelength converting layer 3, and the cover plate 4 have been described in the first embodiment and will not be reiterated herein.

In the present embodiment, the blue-light reflecting layer 5 can be formed on the cover plate 4 and the coverage thereof relative to the lighting structure 1 includes the first and second regions 111, 112. The blue-light reflecting layer 5 is configured to totally reflect blue lights emitted from the first region 111 and allow the transmission of red lights, and totally reflect blue lights emitted from the second region 112 and allow the transmission of green lights. Furthermore, the blue-light reflecting layer 5 can further guide the reflected blue lights from the first and second regions 111, 112 into the third region 113, so that the reflected blue lights can project outwardly from the third region 113. Therefore, the color purity and color conversion efficiency of red, green and blue lights can be improved. Specifically speaking, as shown in FIG. 4 and FIG. 5, the cover plate 4 has a first surface 41 proximate to the wavelength converting layer 3 and a second surface 42 opposite to the first surface 41. The blue-light reflecting layer 5 can be disposed on the first surface 41 or the second surface 42 and cover the first converting layer 31 and the second converting layer 32.

The blue-light reflecting layer 5 can be a DBR (Distributed Bragg Reflector, DBR) layer. For example, the blue-light reflecting layer 5 can consist of a plurality of first oxide layers and a plurality of second oxide layers alternately stacked with each other, wherein each of the first oxide layers has a refractive index different from that of each of the second oxide layers. Each of the first oxide layers can be a silicon dioxide layer and each of the second oxide layers can be a titanium dioxide or niobium pentoxide ($Nb_2O_5$) layer, but the present disclosure is not limited thereto.

Third Embodiment

Figure 7:
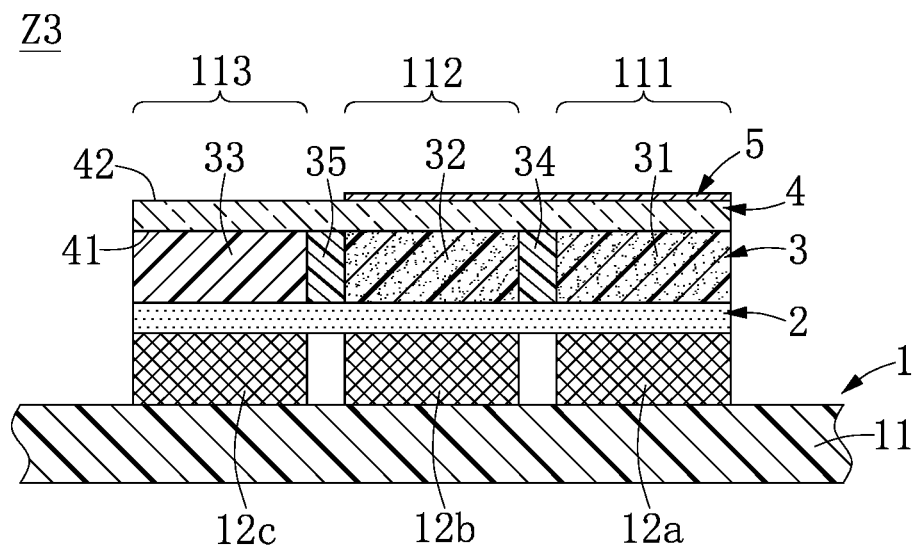
FIG. 7 is a schematic view of the light source module according to the third embodiment of the present disclosure.

Referring to FIG. 7, a third embodiment of the present disclosure provides a light source module Z3 having the same main components as that of the second embodiment. The main difference between the second and third embodiments is that the wavelength converting layer 3 further includes a first light shielding layer 34 and a second light shielding layer 35 that jointly form a black matrix. The first light shielding layer 34 is disposed between the first converting layer 31 and the second converting layer 32 for preventing the red lights produced via the first converting layer 31 and the green lights produced via the second converting layer 32 from color-mixing. The second light shielding layer 35 is disposed between the second converting layer 32 and the transparent layer 33 for preventing the green lights produced via the second converting layer 32 and the blue light passing through the transparent layer 33 from color-mixing.

Figure 8:
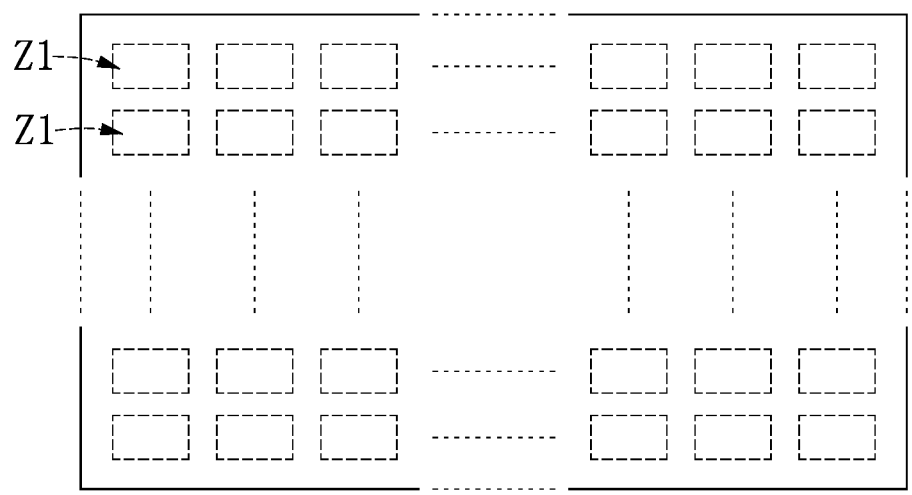
FIG. 8 is a schematic view of a displace device according to the embodiments of the present disclosure.

Referring to FIG. 8, the aforesaid light source modules Z1, Z2, Z3 can be applied to a display device D such as an LED display device. For example, the display device D can includes a predetermined number of the light source modules Z1 that are arranged in a matrix, but the present disclosure is not limited thereto.

In conclusion, the light source module of the present disclosure includes a lighting structure, in which the light emitting elements of the lighting structure are all blue-light emitting elements, a light diffusing layer disposed on the lighting structure and a wavelength converting layer disposed on the light diffusing layer. Therefore, the product cost and the complexity of the driving circuit can be reduced, and the product defects caused by different brightness decaying speeds and driving voltages of the light emitting elements can be avoided.

Furthermore, the light source module can further include a blue-light reflecting layer disposed on a cover plate and covering the first and second converting layers of the wavelength converting layer. Therefore, the color purity and color conversion efficiency of red, green and blue lights can be improved.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source module, comprising:
a lighting structure including a substrate and at least three blue-light emitting elements, wherein the substrate has a first region, a second region adjacent to the first region, and a third region adjacent to the second region, and the blue-light emitting elements are respectively disposed in the first region, the second region, and the third region;
a light diffusing layer disposed on the lighting structure, wherein the light diffusing layer contains light diffusing particles, the content of the light diffusing particles is 5% by weight to 25% by weight based on the total weight of the light diffusing layer, and the light diffusing particles are titanium dioxide particles having a mean particle size between 20 nm and 70 nm;
a wavelength converting layer disposed on the light diffusing layer, wherein the wavelength converting layer includes a first converting layer disposed in the first region, a second converting layer disposed in the second region, and a transparent layer disposed in the third region, a blue light generated from one of the blue-light emitting elements and emitted from the first region is converted to a red light via the first converting layer, and a blue light generated from another one of the blue-light emitting elements and emitted from the second region is converted to a green light via the second converting layer;
a cover plate disposed on the wavelength converting layer; and
a blue-light reflecting layer disposed on the cover plate and covering the first converting layer and the second converting layer.

2. The light source module according to claim 1, wherein the first converting layer contains red phosphors, the second converting layer contains green phosphors, and the transparent layer is formed from a silicone resin.

3. The light source module according to claim 1, wherein the cover plate is a glass cover plate.

4. The light source module according to claim 3, wherein the glass cover plate has a first surface proximate to the wavelength converting layer and a second surface opposite to the first surface, and the blue-light reflecting layer is formed on the first surface.

5. The light source module according to claim 3, wherein the glass cover plate has a first surface proximate to the wavelength converting layer and a second surface opposite to the first surface, and the blue-light reflecting layer is formed on the second surface.

6. The light source module according to claim 1, wherein each of the blue-light emitting elements is a blue LED chip for generating a blue light having a wavelength between 360 nm and 450 nm.

7. The light source module according to claim 1, wherein the wavelength converting layer further includes a first light shielding layer and a second light shielding layer, the first light shielding layer is disposed between the first converting layer and the second converting layer, the second light shielding layer is disposed between the second converting layer and the transparent layer, and the first light shielding layer and the second light shielding layer jointly form a black matrix.

8. A display device comprising a plurality of light source modules according to claim 1.

9. The display device according to claim 8, wherein the first converting layer contains red phosphors, the second converting layer contains green phosphors, and the transparent layer is formed from a silicone resin.

10. The display device according to claim 8, wherein the cover plate is a glass cover plate.

11. The display device according to claim 10, wherein the glass cover plate has a first surface proximate to the wavelength converting layer and a second surface opposite to the first surface, and the blue-light reflecting layer is formed on the first surface.

12. The display device according to claim 10, wherein the glass cover plate has a first surface proximate to the wavelength converting layer and a second surface opposite to the first surface, and the blue-light reflecting layer is formed on the second surface.

13. The display device according to claim 8, wherein each of the blue-light emitting elements is a blue LED chip for generating a blue light having a wavelength between 360 nm and 450 nm.

14. The display device according to claim 8, wherein the wavelength converting layer further includes a first light shielding layer and a second light shielding layer, the first light shielding layer is disposed between the first converting layer and the second converting layer, the second light shielding layer is disposed between the second converting layer and the transparent layer, and the first light shielding layer and the second light shielding layer jointly form a black matrix.

* * * * *